United States Patent
George et al.

(10) Patent No.: US 9,091,924 B2
(45) Date of Patent: Jul. 28, 2015

(54) PHOTORESIST DELIVERY SYSTEM INCLUDING CONTROL VALVE AND ASSOCIATED METHODS

(71) Applicant: STMicroelectronics Pte Ltd., Singapore (SG)

(72) Inventors: Gino George, Singapore (SG); KeenYip Koh, Singapore (SG); CheeChiang Lee, Yishun (SG); Ditto Adnan, Singapore (SG)

(73) Assignee: STMICROELECTRONICS PTE LTD, Singapore (SG)

( * ) Notice: Subject to any disclaimer, the term of this patent is extended or adjusted under 35 U.S.C. 154(b) by 263 days.

(21) Appl. No.: 13/625,210

(22) Filed: Sep. 24, 2012

(65) Prior Publication Data
US 2014/0083557 A1  Mar. 27, 2014

(51) Int. Cl.
G01F 7/00 (2006.01)
G03F 7/16 (2006.01)
H01L 21/67 (2006.01)

(52) U.S. Cl.
CPC .............. *G03F 7/16* (2013.01); *H01L 21/6715* (2013.01)

(58) Field of Classification Search
CPC ........................................................ B65B 3/06
USPC ............... 141/2, 18, 113, 231, 232, 284, 319, 141/320, 346, 347, 363, 364, 365, 366, 141/375; 438/947
See application file for complete search history.

(56) References Cited

U.S. PATENT DOCUMENTS

| | | | | |
|---|---|---|---|---|
| 2,989,091 A * | 6/1961 | Lowenthal | ............ | 141/294 |
| 3,343,718 A * | 9/1967 | Siegel et al. | ............ | 222/1 |
| 3,574,314 A * | 4/1971 | Quercia | ............ | 141/349 |
| 4,389,926 A * | 6/1983 | Joyner | ............ | 99/495 |
| 4,465,112 A * | 8/1984 | Kopp | ............ | 141/284 |
| 4,874,023 A * | 10/1989 | Ulm | ............ | 141/346 |
| 4,991,635 A * | 2/1991 | Ulm | ............ | 141/346 |
| 5,102,010 A * | 4/1992 | Osgar et al. | ............ | 222/1 |
| 5,154,212 A * | 10/1992 | Weber | ............ | 141/353 |
| 5,273,083 A * | 12/1993 | Burrows | ............ | 141/18 |
| 5,379,813 A * | 1/1995 | Ing | ............ | 141/351 |
| 5,388,620 A * | 2/1995 | Lasserre et al. | ............ | 141/20 |
| 5,425,404 A * | 6/1995 | Dyer | ............ | 141/351 |
| 5,431,205 A * | 7/1995 | Gebhard | ............ | 141/351 |
| 5,526,961 A * | 6/1996 | Burrows | ............ | 222/185.1 |
| 5,988,415 A * | 11/1999 | White | ............ | 215/266 |
| 6,092,569 A * | 7/2000 | Simmel et al. | ............ | 141/231 |
| 6,148,838 A * | 11/2000 | Tsay et al. | ............ | 137/2 |
| 6,390,156 B1 * | 5/2002 | Hetherington et al. | ............ | 141/351 |
| 8,322,571 B2 * | 12/2012 | Hovinen et al. | ............ | 222/65 |
| 2005/0224133 A1 * | 10/2005 | Yui et al. | ............ | 141/18 |
| 2007/0207259 A1 * | 9/2007 | Kulkarni et al. | ............ | 427/8 |
| 2009/0314798 A1 * | 12/2009 | Hovinen et al. | ............ | 222/23 |
| 2014/0083557 A1 * | 3/2014 | George et al. | ............ | 141/2 |
| 2014/0083564 A1 * | 3/2014 | Yan | ............ | 141/319 |

* cited by examiner

*Primary Examiner* — Timothy L Maust
*Assistant Examiner* — Andrew Schmid
(74) *Attorney, Agent, or Firm* — Allen, Dyer, Doppelt, Milbrath & Gilchrist, P.A.

(57) ABSTRACT

A photoresist delivery system includes a photoresist pump, a photoresist reservoir coupled to the photoresist pump, and a photoresist container. A control valve is between the photoresist reservoir and the photoresist container and is movable from a closed position to an open position upon engagement of the photoresist container with the photoresist reservoir to replenish photoresist therein.

16 Claims, 8 Drawing Sheets

WHILE CLOSED

WHILE OPEN

PHOTORESIST DELIVERY SYSTEM INCLUDING CONTROL VALVE AND ASSOCIATED METHODS

FIELD OF THE INVENTION

The present invention relates to the field of photolithography, and more particularly, to a photoresist delivery system, and related methods.

BACKGROUND OF THE INVENTION

Integrated circuits contain millions of individual elements that are formed by patterning the materials, such as silicon, metal and/or dielectric layers, that make up each integrated circuit. A technique used throughout the industry for forming such patterns is photolithography.

A typical photolithography process sequence generally includes depositing one or more uniform photoresist (resist) layers on the surface of a substrate, drying and curing the deposited layers, patterning the substrate by exposing the photoresist layer to electromagnetic radiation that is suitable for modifying the exposed layer, and then developing the patterned photoresist layer.

Photolithography is an important process of wafer fabrication. In the photolithographic process, photoresist chemicals are dispensed on the wafer using high precision chemical dispensing pumps known as photoresist pumps.

A photoresist pump is desirably supplied with an undisturbed supply of photoresist to avoid air bubbles from going inside the pump. One approach is to supply the photoresist directly from a photoresist bottle 20 to the photoresist pump 30, as shown in FIG. 1.

There are several drawbacks to this approach. The photoresist bottle 20 needs to be changed before the photoresist level reaches the bottom tip of the tubing 24 that extends within the bottle so as to prevent air bubbles from going inside the pump 30. For a typical size photoresist bottle, photoresist is wasted since typically about 300 ml of residual photoresist 26 is left in the bottle 20 when changing to a full photoresist bottle. Moreover, for opaque bottles, even more residual photoresist may be wasted since it is difficult to see the photoresist level. This cost of unused photoresist can be substantial for large scale applications, and over an extended period of time.

Another approach is based on a photoresist reservoir 40' with a controller 42' connected to two photoresist bottles 20', as illustrated in FIG. 2. This approach is known as an automated delivery system (ADS) and consumes the photoresist from each bottle until the tip of the respective tubing 24' within each photoresist bottle 20' receives air bubbles. This system provides an undisturbed source of photoresist to the pump 30' by maintaining the photoresist level inside the photoresist reservoir 40'.

There are several drawbacks to this approach. This type of automated delivery system is expensive, and the operating costs can also be high. Even though there is not a concern of the photoresist pump receiving air bubbles, the system is not able to fully consume all of the photoresist from the photoresist bottles. An average wastage is about 200 ml per bottle. Again, this cost can be substantial for large scale applications, and over an extended period of time.

U.S. published patent application no. 2007/0207259 discloses an integrated photolithography chemical delivery system for a track lithography system. The integrated photolithography chemical delivery system includes a buffer vessel adapted to receive a photolithography chemical from a source volume. The integrated photolithography chemical delivery system also includes a photolithography chemical pump connected to the buffer vessel. A flow control valve is a hybrid manual/pneumatic valve adapted to provide control of the flow of photolithography chemicals from a photoresist bottle in an operating mode and to provide a manual shut-off feature in a service mode. A pressure valve is coupled to the photoresist bottle. Even in this integrated photolithography chemical delivery system, residual photoresist is left in the bottle when changing to a full photoresist bottle.

SUMMARY OF THE INVENTION

In view of the foregoing background, it is therefore an object of the present invention to reduce the amount of photoresist wastage that occurs during a photolithography process.

This and other objects, features, and advantages in accordance with the present invention are provided by a photoresist delivery system comprising at least one photoresist pump, a photoresist reservoir coupled to the at least one photoresist pump, and a photoresist container. A control valve may be between the photoresist reservoir and the photoresist container, and may be movable from a closed position to an open position upon engagement of the photoresist container with the photoresist reservoir to replenish photoresist therein.

The control valve may be coupled to the photoresist container, and the photoresist container may be placed in an inverted position when the control valve engages the photoresist reservoir. This advantageously allows the photoresist to be used without any residual wastage. Since the control valve is in a closed position prior to engagement with the photoresist reservoir, this prevents photoresist from spilling when inverting the photoresist container.

The photoresist reservoir may comprise a control valve receiving assembly having a recessed opening to receive the control valve. The recessed opening may be defined by side walls and a bottom surface coupled thereto, with the bottom surface comprising a pin extending outwardly therefrom. The bottom surface of the recessed opening may also be configured as a strainer. The control valve may comprise a plug that is moveable from the closed position to the open position upon engagement with the pin. The plug may be spring biased in a normally closed position, and may include an opening therein for receiving a tip of the pin.

The photoresist delivery system may further comprise at least one photoresist level monitor coupled to the photoresist reservoir.

A photoresist container loader may be configured to receive the photoresist container in a non-inverted position. The photoresist container loader may then place the photoresist container in an inverted position for the control valve to engage the photoresist reservoir.

Another aspect is directed to a method for operating a photoresist delivery system as described above. The method may comprise providing a photoresist container and a control valve carried by the photoresist container, with the control valve to be removably coupled to the photoresist reservoir. The method may further comprise engaging the photoresist container with the photoresist reservoir to move the control valve from a closed position to an open position to replenish photoresist in the photoresist reservoir.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime and double notations are used to indicate similar elements in alternative embodiments.

Figure 1:
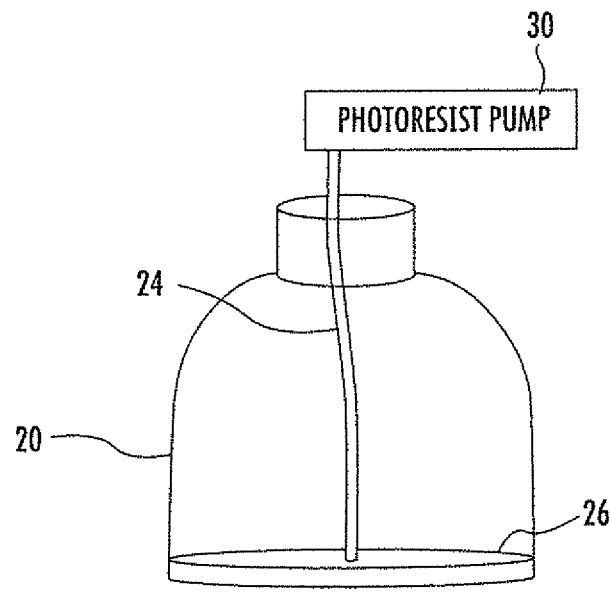
FIG. 1 is a schematic diagram of one embodiment of a photoresist delivery system in accordance with the prior art.
Figure 2:
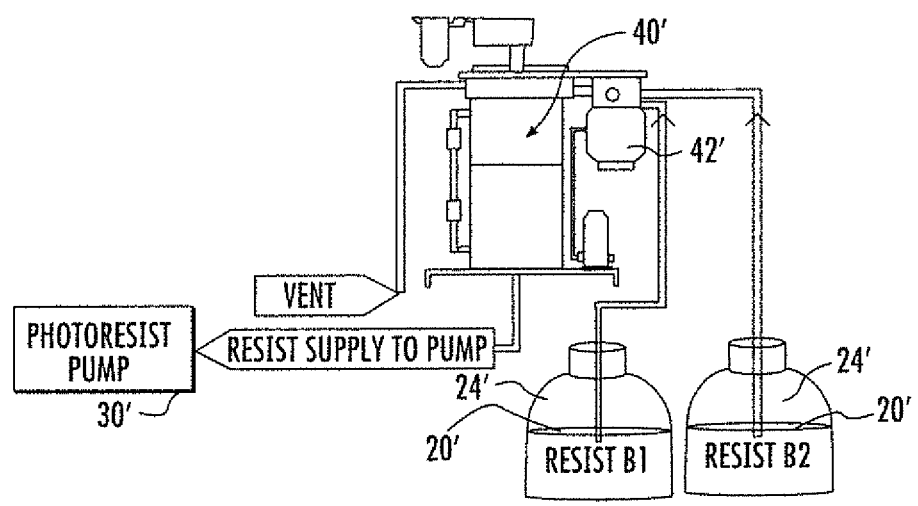
FIG. 2 is a schematic diagram of another embodiment of a photoresist delivery system in accordance with the prior art.
Figure 3:
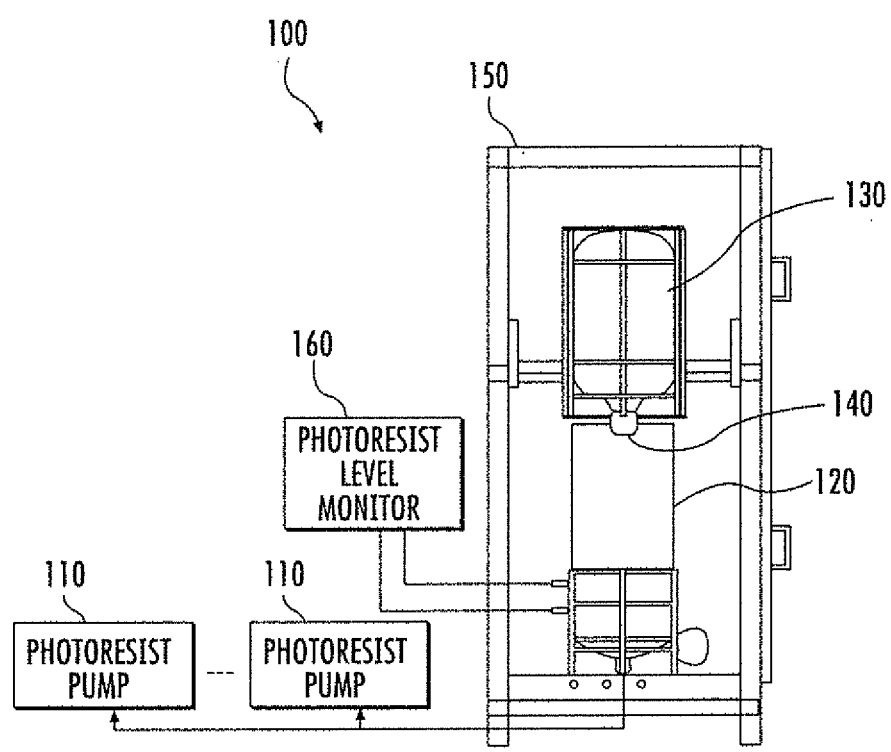
FIG. 3 is a schematic diagram of a photoresist delivery system in accordance with the present invention.

Referring initially to FIG. 3, a photoresist delivery system 100 includes at least one photoresist pump 110, a photoresist reservoir 120 coupled to the at least one photoresist pump, and a photoresist container or bottle 130 including a control valve 140 to be removably coupled to the photoresist reservoir to replenish photoresist therein. The control valve 140 is movable from a closed position to an open position upon engagement with the photoresist reservoir 120.

The photoresist delivery system 100 is also referred to as an inverted container system (ICS) or an inverted bottle system (IBS). The photoresist reservoir 120, the photoresist container 130 and the control valve 140 may be housed within a cabinet 150. For illustration purposes, the at least one pump 110 includes 2 pumps, even though more pumps may be used.

By placing the photoresist container 130 in an inverted position, no residual photoresist is wasted by remaining in the photoresist container when switching to a full replacement photoresist container. To prevent leakage or spillage of the photoresist from the photoresist container 130 while being inverted, the control valve 140 remains in a closed position until engagement with the photoresist reservoir 120.

A photoresist level monitor 160 may be coupled to the photoresist reservoir 120. When a level of the photoresist drops below a set level, then an alarm is sounded so that the photoresist container 130 may be exchanged with a full one.

Figure 4:
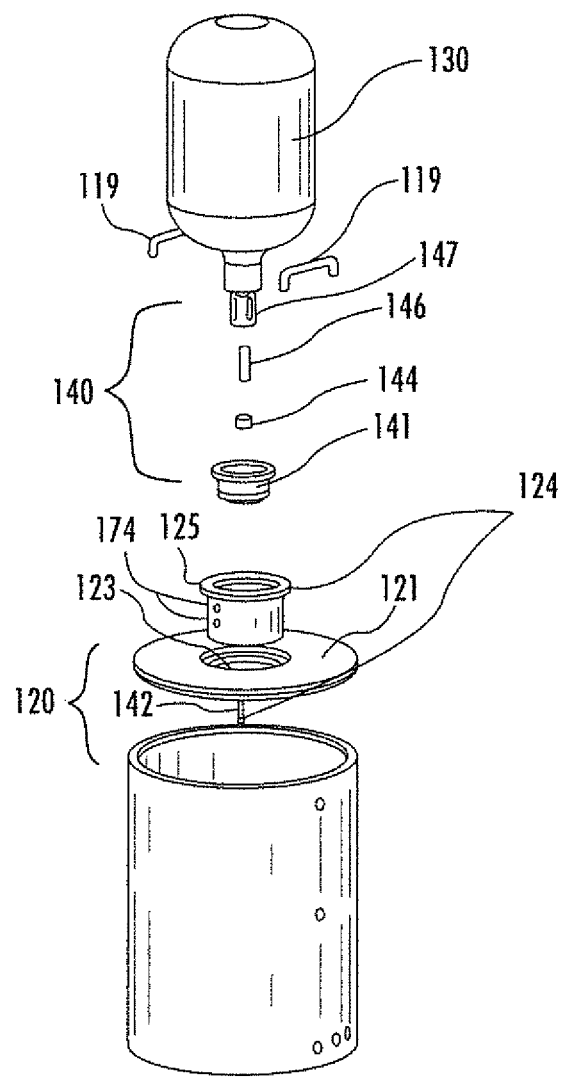
FIG. 4 is an exploded view of the photoresist reservoir, the control valve and the photoresist container shown in FIG. 3.

An exploded view of the photoresist reservoir 120, the control valve 140, and the photoresist container 130 is provided in FIG. 4. The photoresist container 120 includes a removable cover plate 121 with an opening 123 extending through the cover plate. Handles 119 may be coupled to the removable cover plate 121. The removable cover plate 121 is configured to receive a control valve receiving assembly 124. The control valve receiving assembly 124 includes an insert or locator 125 that is received by the opening 123 in the removable cover plate 121. The insert 125 also carries a spring activating pin 142.

The control valve 140 includes a cap 141, and plug or spring stopper 144 that is movable between a closed position and an open position within the cap upon engagement with the spring activating pin 142. A spring 146 contacts the plug 144, and the spring is held in place by a spring holder 147. The spring holder 147 and spring 146 are carried by the cap 141 and are inserted into an opening in the photoresist container 130.

Figure 5:
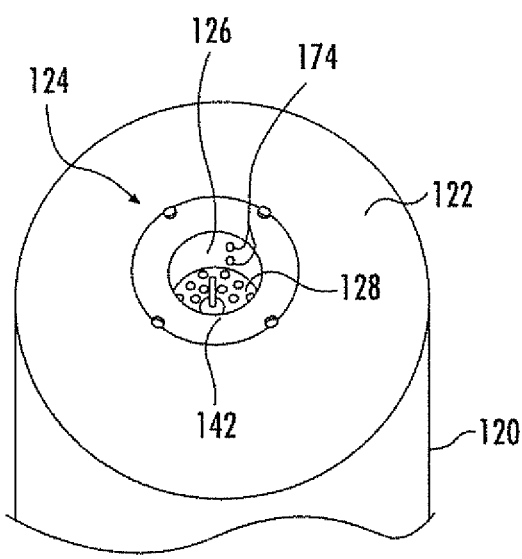
FIG. 5 is a perspective view of a control valve receiving assembly mounted to an upper surface of the photoresist reservoir shown in FIG. 4.

An upper surface 122 of the photoresist reservoir 120 is configured to receive the control valve 140, as illustrated in FIG. 5. The control valve receiving assembly 124 is mounted to the upper surface of the photoresist reservoir 120. The recessed opening includes side walls 126 and a bottom surface 128 coupled thereto, with the bottom surface comprising the spring activating pin 142 extending outwards therefrom. The bottom surface 128 of the recessed opening is configured as a strainer.

Figure 6:
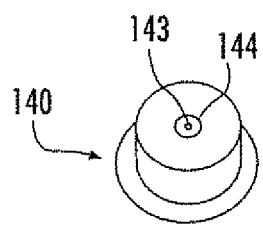
FIG. 6 is a perspective view of the control valve that is to be received by the control valve receiving assembly shown in FIG. 5.

A perspective view of the control valve 140 that is to be received by the control valve receiving assembly 124 is shown in FIG. 6. The control valve 140 includes a plug 144 that is moveable from the closed position to the open position upon engagement with the spring activating pin 142. The plug 144 is spring biased in a normally closed position, and includes an opening 143 therein for receiving a tip of the pin 142. The recessed opening and the control valve 140 are circular shaped.

Figure 7:
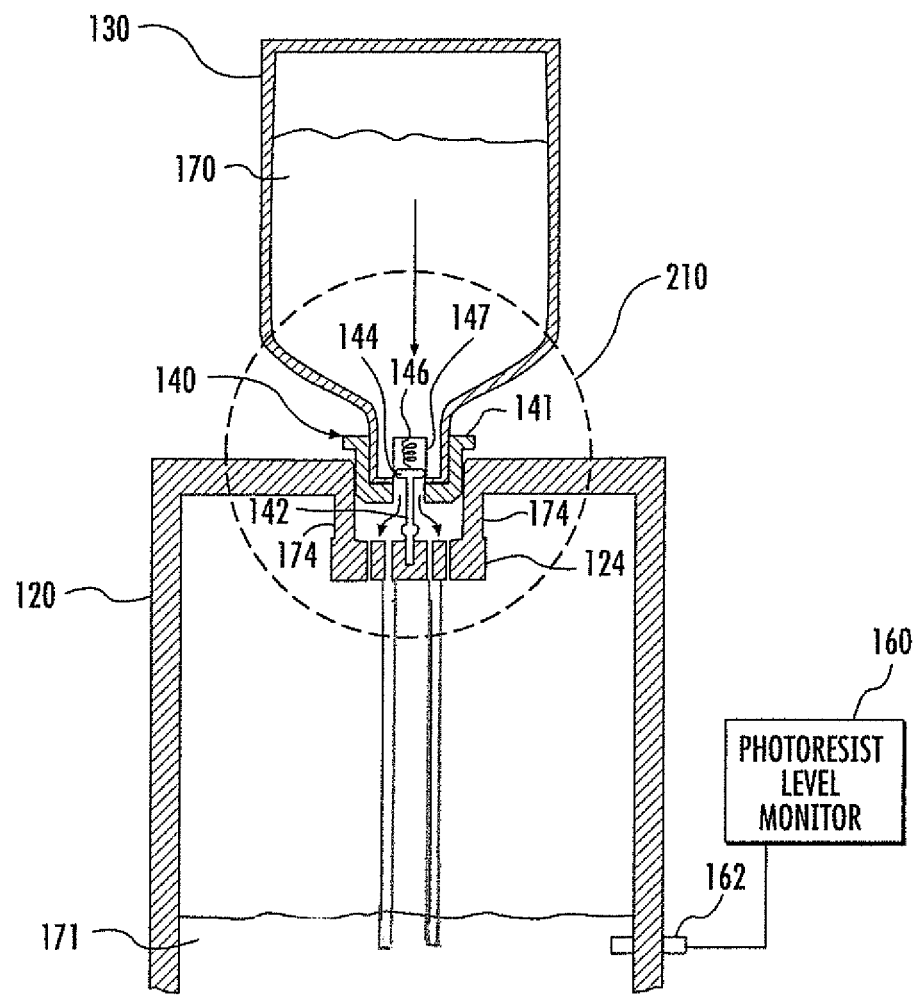
FIG. 7 is a cross-sectional side view of the photoresist container and the control valve, with the control valve being engaged with the photoresist reservoir in accordance with the present invention.
Figure 8:
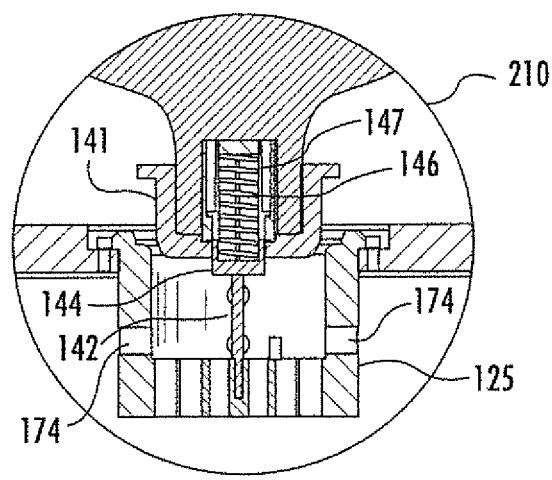
FIG. 8 is an enlarged sectional view of the control valve from FIG. 7 with the plug in a closed position.
Figure 9:
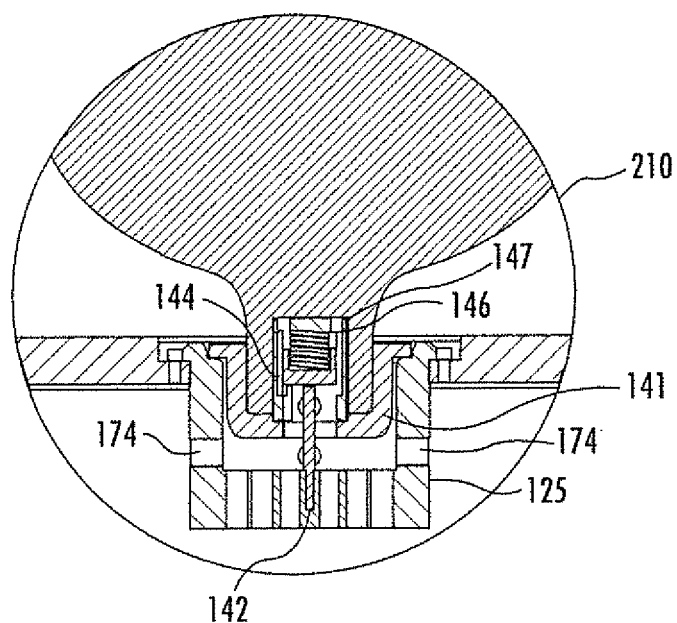
FIG. 9 is an enlarged sectional view of the control valve from FIG. 7 with the plug in an open position.

Referring now to FIGS. 7-9, a cross-sectional side view of the photoresist container 130 and the control valve 140, with the control valve being engaged with the photoresist reservoir 120, will be discussed. The control valve 140 includes the cap 141 that is sized to fit over the opening of the photoresist container 130. The cap 141 carries the spring holder 147 and the spring 146 which are inserted into an opening in the photoresist container 130. The opposite side of the cap 141 is sized to fit within the recessed opening of the control valve receiving assembly 124.

Prior to the control valve 140 being placed in the recessed opening, the plug 144 is spring biased in a normally closed position, as best shown in the enlarged section 210 in FIG. 8. The spring 146 is held within the spring holder 147. The spring holder 147 allows the plug 144 and spring 146 to move from the closed position to the open position upon engagement with the pin 142 in the recessed opening of the control valve receiving assembly 124, as best shown in the enlarged section 210 in FIG. 9. The spring holder 147 also allows the photoresist 170 within the photoresist container 130 to exit the control valve 140 when in the open position.

The photoresist 170 flows from the control valve 140 through the bottom surface 128 of the recessed opening of the control valve receiving assembly 124. The bottom surface 128 is configured as a strainer so as to filter any undesirable containments that may happen to be within the photoresist container 130.

Air is needed for the photoresist 170 to flow from the photoresist container 130 into the photoresist reservoir 120. That is, the photoresist 170 inside the photoresist container 130 needs to be replaced by air for the photoresist 170 to flow. When the level 171 of the photoresist covers the air holes 174 in the insert 125 of the control valve receiving assembly 124, then the photoresist 170 stops flowing from the photoresist container 130. In one embodiment, the insert 125 has four air holes 174.

When the pin 142 engages with the plug 144 in the control valve 140, a gap between the plug and the bottom surface 128 of the control valve receiving assembly 124 allows the photoresist to flow down continuously into the photoresist reservoir 120 until the level 171 of the photoresist covers the air holes 174. This causes the flow of the photoresist 170 into the photoresist reservoir 120 to stop.

As noted above, the photoresist delivery system 100 includes at least one photoresist level monitor 160 coupled to the photoresist reservoir 120. One or more sensors 162 may be used to monitor the level 171 of the photoresist. When the photoresist level 171 drops below the sensor 162, an alarm may sound to notify the operator that a full photoresist container 130 is needed.

Since the photoresist container 130 is in an inverted position when the plug 144 engages the control valve receiving assembly 124, this advantageously allows the photoresist to be used without any wastage before changing to a full bottle. Moreover, since the plug 144 is in a closed position prior to engagement with the control valve receiving assembly 124, this prevents photoresist from spilling when inverting the photoresist container 130.

Figure 10:
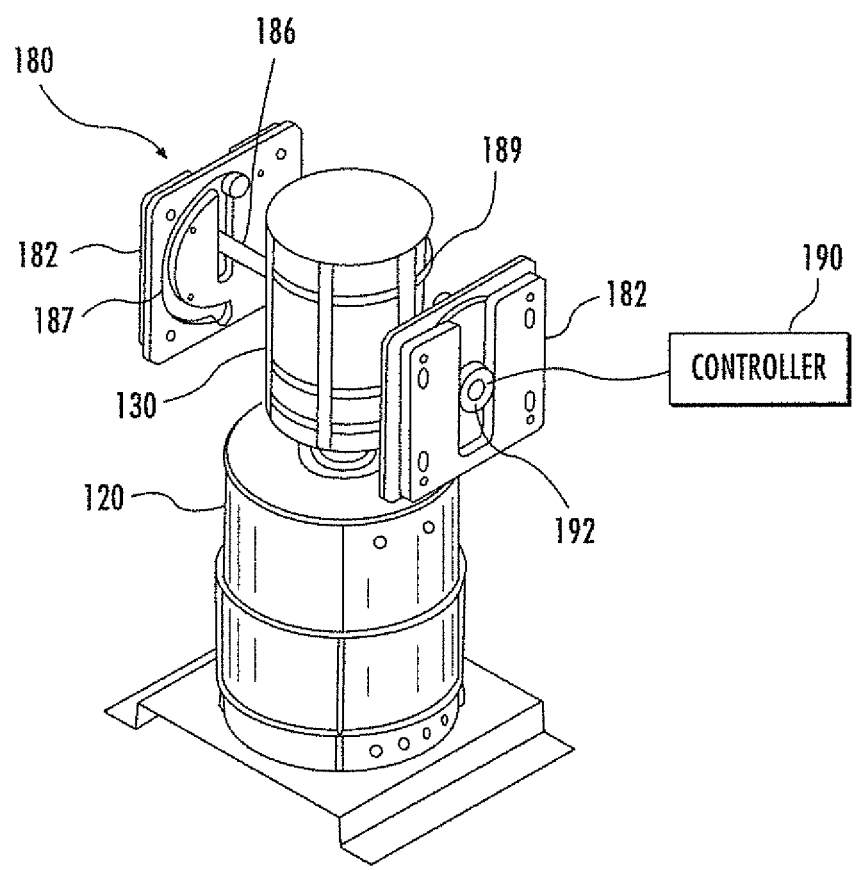
FIG. 10 is a perspective side view of a photoresist container loader loading a photoresist container to a photoresist reservoir in accordance with the present invention.

The photoresist delivery system 100 also includes a photoresist container loader 180, as illustrated in FIG. 10. The photoresist container loader 180 is configured to load the photoresist container 130 from an non-inverted position to an inverted position.

A pair of spaced apart side plates 182 is attached to the interior walls of the cabinet 150. A carriage 189 carries the photoresist container 130. There is a respective shaft 186 that extends between each side plate 182 and the carriage 189. As best illustrated in FIG. 10 FIG. 7, each side plate 182 includes a groove 187 that is used to guide the photoresist container 130 between the non-inverted position and the inverted position. A first portion of the grove 187 is curved so as to allow the carriage 189 to receive the photoresist container 130 in the non-inverted position. A second part of the groove 187 is vertical so as to place the photoresist container 130 in the inverted position. A controller 190 is used to operate a gear assembly 192 so as to rotate the photoresist container 130 between the two positions.

Figure 11:
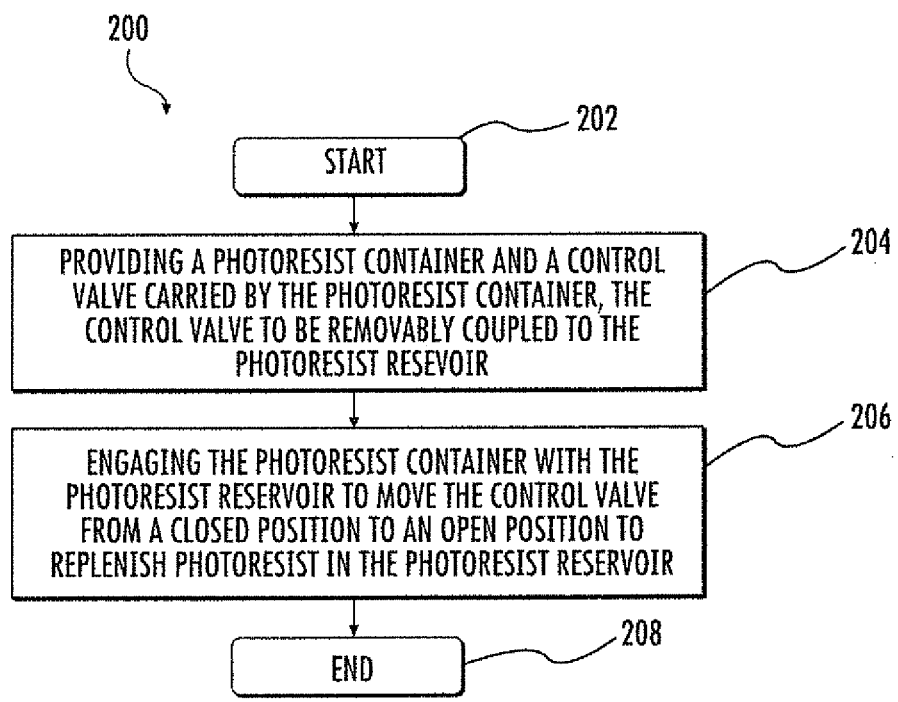
FIG. 11 is a flowchart illustrating a method for operating a photoresist delivery system in accordance with the present invention.

Referring now to the flowchart 200 illustrated in FIG. 11, a method for operating a photoresist delivery system 100 will be discussed. From the start (Block 202), the method comprises providing a photoresist container 130 and a control valve 140 carried by the photoresist container at Block 204. The control valve 140 is to be removably coupled to the photoresist reservoir 120. The method further comprises engaging the photoresist container 130 with the photoresist reservoir 120 to move the control valve 140 from a closed position to an open position to replenish photoresist in the photoresist reservoir at Block 206. The method ends at Block 208.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A photoresist delivery system comprising:
at least one photoresist pump;
a photoresist reservoir coupled to said at least one photoresist pump;
a photoresist container; and
a control valve between said photoresist reservoir and said photoresist container and being movable from a closed position to an open position upon engagement of said photoresist container with said photoresist reservoir to replenish photoresist therein, with the photoresist in said photoresist container being gravity fed into said photoresist reservoir;
said photoresist reservoir comprising a control valve receiving assembly having a recessed opening to receive said control valve, with the recessed opening being defined by side walls and a bottom surface coupled thereto, with said sides walls including at least one air hole adjacent said control valve so that when a level of the photoresist therein covers the at least one air hole, then the photoresist is no longer gravity fed into said photoresist reservoir.

2. The photoresist delivery system according to claim 1, wherein said control valve is coupled to said photoresist container, and wherein said photoresist container is placed in an inverted position when said control valve engages said photoresist reservoir.

3. The photoresist delivery system according to claim 1, wherein said bottom surface of the recessed opening comprises a pin extending outwardly therefrom; and wherein said control valve comprises a plug that is moveable from the closed position to the open position upon engagement with said pin.

4. The photoresist delivery system according to claim 3, wherein the bottom surface of the recessed opening is configured as a strainer.

5. The photoresist delivery system according to claim 3, wherein said plug is spring biased in a normally closed position, and includes an opening therein for receiving a tip of said pin.

6. The photoresist delivery system according to claim 1, wherein the recessed opening and said control valve are circularly shaped.

7. The photoresist delivery system according to claim 1, further comprising photoresist tubing extending from said control valve receiving assembly into said photoresist reservoir.

8. The photoresist delivery system according to claim 1, further comprising a photoresist level monitor coupled to said photoresist reservoir.

9. The photoresist delivery system according to claim 1, further comprising a photoresist container loader configured to receive said photoresist container in a non-inverted position, and to place said photoresist container in an inverted position for said control valve to engage said photoresist reservoir.

10. A photoresist delivery system comprising:
at least one photoresist pump;
a photoresist reservoir coupled to said at least one photoresist pump, and comprising a control valve receiving assembly having a recessed opening, the recessed opening being defined by side walls and a bottom surface coupled thereto, with said sides walls including at least one air hole and with said bottom surface comprising a pin extending outwardly therefrom;
a photoresist container; and a control valve between said photoresist reservoir and said photoresist container, and comprising a plug movable from a closed position to an open position upon engagement with said pin to replenish photoresist in said photoresist reservoir, with the photoresist in said photoresist container being gravity fed into said photoresist reservoir until a level of the photoresist therein covers the at least one air hole.

11. The photoresist delivery system according to claim 10, wherein said control valve is coupled to said photoresist container, and wherein said photoresist container is placed in an inverted position when said plug engages said pin.

12. The photoresist delivery system according to claim 10, wherein the bottom surface of the recessed opening is configured as a strainer.

13. The photoresist delivery system according to claim 10, wherein said plug is spring biased in a normally closed position, and includes an opening therein for receiving a tip of said pin.

14. The photoresist delivery system according to claim 10, further comprising photoresist tubing extending from said control valve receiving assembly into said photoresist reservoir.

15. The photoresist delivery system according to claim 10, further comprising at least one photoresist level monitor coupled to said photoresist reservoir.

16. The photoresist delivery system according to claim 10, further comprising a photoresist container loader configured to receive said photoresist container in a non-inverted position, and to place said photoresist container in an inverted position for said control valve to engage said photoresist reservoir.

* * * * *